United States Patent [19]
Tsuruoka et al.

[11] Patent Number: 5,808,515
[45] Date of Patent: Sep. 15, 1998

[54] SEMICONDUCTOR AMPLIFYING CIRCUIT HAVING IMPROVED BIAS CIRCUIT FOR SUPPLYING A BIAS VOLTAGE TO AN AMPLIFYING FET

[75] Inventors: Yoshiyasu Tsuruoka, Sapporo; Takahisa Kawai, Kawasaki, both of Japan

[73] Assignee: Fujitsu Limited, Kawasaki, Japan

[21] Appl. No.: 730,392

[22] Filed: Oct. 15, 1996

[30] Foreign Application Priority Data

Jan. 18, 1996 [JP] Japan ................................... 8-006230
Jul. 31, 1996 [JP] Japan ................................... 8-201568

[51] Int. Cl.$^6$ ........................................................ H03F 3/16
[52] U.S. Cl. ........................................ 330/277; 330/296
[58] Field of Search ................................... 330/277, 286, 330/296, 307

[56] References Cited

U.S. PATENT DOCUMENTS

| | | | |
|---|---|---|---|
| 4,912,430 | 3/1990 | Frank | 330/296 X |
| 4,990,973 | 2/1991 | Ishikawa et al. | 330/296 X |
| 5,337,019 | 8/1994 | Musiol | 330/277 |
| 5,675,290 | 10/1997 | Tsukahara et al. | 330/277 |

FOREIGN PATENT DOCUMENTS 2151109  6/1990  Japan .
6-85558  3/1994  Japan .

*Primary Examiner*—Steven Mottola
*Attorney, Agent, or Firm*—Nikaido, Marmelstein, Murray & Oram LLP

[57] ABSTRACT

A semiconductor amplifying circuit of the present invention comprises: an amplifying field effect transistor device having a gate supplied with an input signal and a drain for outputting an amplified output signal; and a bias circuit for supplying a bias voltage to said gate of said amplifying transistor device. The bias circuit includes: a first bias voltage generator having a first dummy field effect transistor device formed on a same substrate as said amplifying transistor device is formed, and a voltage feedback bias circuit for supplying a bias voltage to a gate of said first dummy transistor device; and a second bias voltage generator for supplying a lower potential to said voltage feedback bias circuit when a drain current of said field effect transistor device increases, and supplying a higher potential to said voltage feedback bias circuit when said drain current decreases. A gate voltage of said first dummy transistor device is supplied as a bias voltage to said gate of said amplifying transistor device. The power supply can be applied directly to the drain of the amplifying transistor so as to maximizing the transistor performance.

18 Claims, 10 Drawing Sheets

SEMICONDUCTOR AMPLIFYING CIRCUIT HAVING IMPROVED BIAS CIRCUIT FOR SUPPLYING A BIAS VOLTAGE TO AN AMPLIFYING FET

BACKGROUND OF THE INVENTION

1. Field of the Invention

The present invention relates to a semiconductor amplifying circuit, and, more particularly, to an improvement of a bias circuit for a power amplifying circuit which uses a GaAs FET (Field Effect Transistor).

2. Description of the Related Art

FETs each having a Schottky type gate electrode formed on a semi-insulating semiconductor substrate like GaAs are widely used as power amplifiers which amplify high-frequency signals. For instance, this power amplifier is used in the form of an MMIC (Microwave Monolithic Integrated Circuit) in an apparatus which needs to be made compact, such as a mobile communication terminal like a portable telephone.

Figure 14:
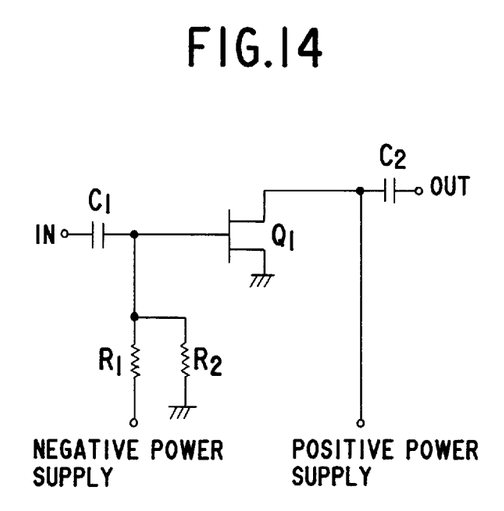
FIG. 14 is a circuit diagram of a conventional power amplifying circuit which uses a basic GaAs FET.

FIG. 14 shows a basic power amplifying circuit which uses a GaAs FET. A high-frequency input signal IN is input to the gate electrode of a transistor Q1 via an input-coupled capacitor C1, and a high-frequency output signal OUT, which has been amplified via an outputcoupled capacitor C2, appears at the drain electrode. A bias voltage for the gate, which is acquired by dividing the potential difference between the ground potential and the voltage from a negative supply voltage by resistors R1 and R2, is applied to the gate electrode. The drain electrode is connected via an unillustrated drain resistor to a positive power supply, and a full voltage from the positive power supply is applied between the gate and source of the transistor Q1.

This transistor is generally constituted by forming a Schottky type gate electrode on the channel region between the source and drain, which is formed by doping the surface of a semi-insulating semiconductor substrate with an impurity. The gate electrode is formed in a recess area formed in the surface of the channel region. It is inevitable that the drain current varies due to a productional variation which occurs at the time of forming such a recess structure or channel region. It is very important to suppress a variation in drain current in achieving an MMIC of GaAs FETs.

The parameters which vary from the productional viewpoint are the drain saturation current $I_{DDS}$ when the gate-source potential is set to zero, and the pinch-off voltage $V_p$ as the gate-source voltage when with a negative voltage applied between the gate and source, the depletion layer which extends from the gate electrode reaches the bottom of the channel region and the drain current becomes zero. It is known that as shown in FIG. 15, the curve connecting the drain saturation current $I_{DSS}$ and the pinch-off voltage $V_p$ varies as if to shift in parallel as indicated by the arrows in the diagram.

Figure 15:
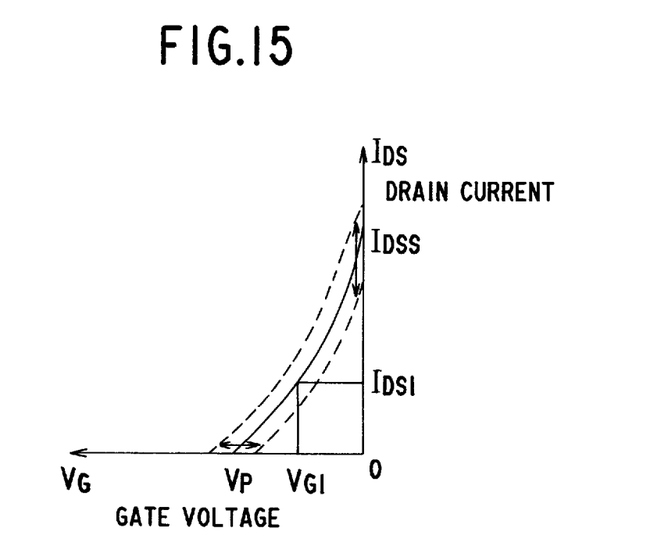
FIG. 15 is a graph showing variations in the drain saturation current and the pinch-off voltage of a transistor.

Even if the gate bias voltage is set to $V_{G1}$ so that the drain current for the bias voltage becomes $I_{DS1}$ based on the expected characteristic indicated by the solid line in FIG. 15, the drain current $I_{DS1}$ does not become constant due to a variation in manufactured transistors. Depending on the degree of variation, therefore, the drain current $I_{DS}$ significantly changes as is apparent from the graph in FIG. 16 which shows the simulated relationship between the drain current and the degree of variation. More specifically, if the drain saturation current $I_{DDS}$ and the pinch-off voltage $V_p$ are made to vary by ±40% with a given relativity, when the gate bias voltage of an FET with a standard drain saturation current $I_{DDS}$ of 50 mA is set in such a manner that the drain current $I_{DS}$ becomes 20 mA by adjusting the resistances of the resistors R1 and R2, the drain current $I_{DS}$ varies by about ±80%.

Figure 16:
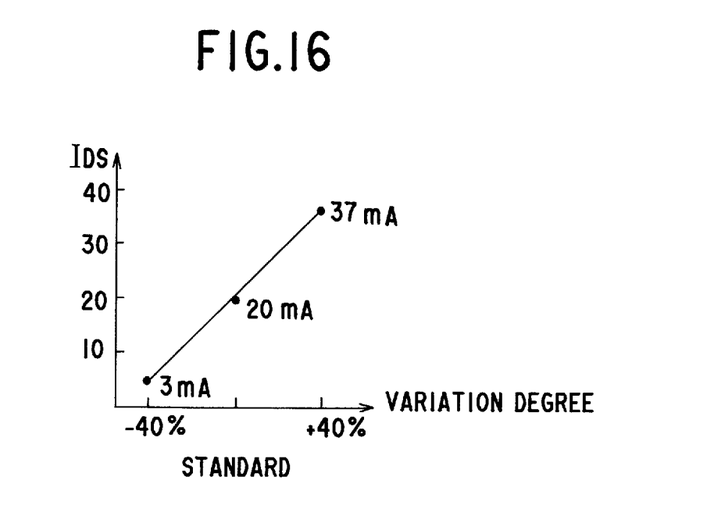
FIG. 16 is a diagram showing the simulated relationship between the drain current and the degree of variation.
Figure 17:
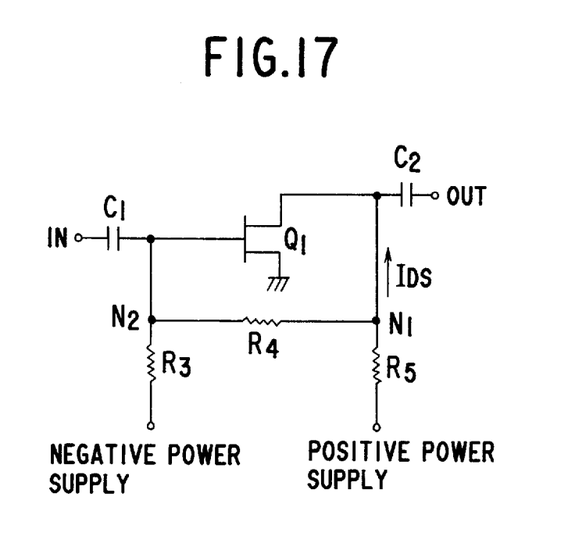
FIG. 17 is a circuit diagram of a voltage feedback bias circuit according to another prior art.
Figure 18:
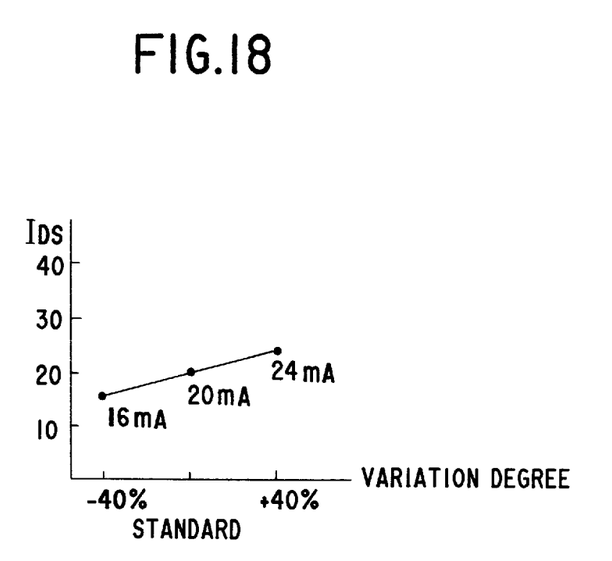
FIG. 18 is a diagram showing the simulated relationship between the drain current and the degree of variation for the bias circuit in FIG. 17.

There has been known a voltage feedback bias circuit shown in FIG. 17 as one means to compensate this variation. This bias circuit has three resistors R3, R4 and R5 connected as illustrated. According to this circuit, when the drain current $I_{DS}$ of a transistor Q1 varies in the positive direction, the increased drain current $I_{DS}$ causes the potential at a node N1 to fall and also causes the potential at a node N2, which is acquired by the voltage division by the resistors R3 and R4, to fall. As a result, the gate bias voltage increases in the negative direction to reduce the drain current $I_{DS}$. Accordingly, the simulation results similar to those shown in FIG. 16 are improved as shown in FIG. 18. Specifically, with respect to a variation in the characteristic of the transistor by ±40%, the drain current $I_{DS}$ varies from 16 mA to 24 mA or by ±20%.

It is apparent from the above that the voltage feedback bias circuit can considerably compensate a variation in drain current with respect to a variation in the characteristic of the device as compared with the fixed bias circuit shown in FIG. 14. This voltage feedback bias circuit however still suffers a variation by ±20%. Such a variation cannot be neglected for portable telephones or like which require a power amplifying circuit with a higher precision.

In addition, the voltage feedback bias circuit in FIG. 17 has some shortcomings. First, power amplifying circuits for use in mobile communication terminals like portable telephones should meet severe standards for the characteristics and efficiency and require the maximum performance of FETs. Since the voltage feedback bias circuit in FIG. 17 has the resistor R5 connected between the drain electrode and the positive power supply, when the drain current flows, a voltage drop occurs which makes the voltage to be applied to the drain lower than the supply voltage. This degrades the high-frequency characteristic, such as saturation power.

Figure 19:
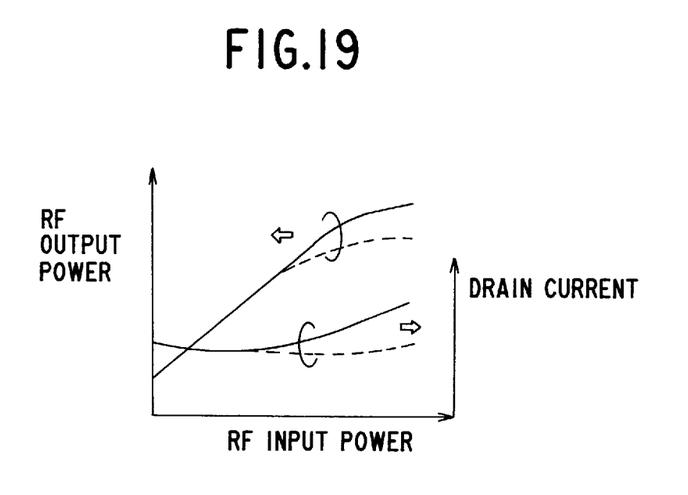
FIG. 19 is a diagram illustrating the relationship among the input power, the output power and the drain current of the bias circuit in FIG. 17.

Secondly, while the ordinary FET shows the characteristic as indicated by the solid line in the graph in FIG. 19 which illustrates the relationship among the input power, the output power and the drain current. The FET characteristic, when the voltage feedback bias circuit in FIG. 17 is used, becomes as indicated by the broken line. The graph shows that as the high-frequency (RF: Radio Frequency) input power increases as indicated by the solid line, the drain current of the ordinary FET increases accordingly, thus increasing the saturation output power, as indicated by the solid line. If the bias circuit in FIG. 17 is directly connected to the transistor Q1 of the power amplifying circuit, however, even when the high-frequency input power increases, an increase in the drain current is suppressed by the resistor R5 connected to the drain side as mentioned above, resulting in the characteristic as indicated by the broken line in FIG. 19. Therefore, the saturation output power on the output side decreases.

SUMMARY OF THE INVENTION

Accordingly, it is a primary objective of the present invention to provide an amplifying circuit having a bias circuit which operates in such a way as to output a constant drain current when no high-frequency input signal is supplied to the input of the bias circuit, with respect to a productional variation of transistors.

It is another objective of this invention to provide an amplifying circuit having a bias circuit which can apply a sufficient voltage between the drain and source of an FET in the amplifying circuit to maximize the performance of the FET.

It is a further objective of this invention to provide an amplifying circuit which increases the drain current in accordance with an increase in input power when a high-frequency input signal is supplied to the amplifying circuit.

To achieve the above objectives, a semiconductor amplifying circuit according to this invention comprises:

an amplifying field effect transistor device having a gate supplied with an input signal and a drain for outputting an amplified output signal; and a bias circuit for supplying a bias voltage to the gate of the amplifying transistor device, the bias circuit including, a first bias voltage generator having a first dummy field effect transistor device formed on a same substrate as the amplifying transistor device is formed, and a voltage feedback bias circuit for supplying a bias voltage to a gate of the first dummy transistor device, and a second bias voltage generator for supplying a lower potential to the voltage feedback bias circuit when a drain current of the field effect transistor device increases, and supplying a higher potential to the voltage feedback bias circuit when the drain current decreases, wherein a gate voltage of the first dummy transistor device is supplied as a bias voltage to the gate of the amplifying transistor device.

The first bias voltage generator may further have a first resistor provided between a drain of the first dummy transistor device and a first potential, and a second resistor provided between a node between the first resistor and the drain of the first dummy transistor device and the gate thereof.

The second bias voltage generator may have a series circuit of a second dummy field effect transistor device and a predetermined resistor element provided between predetermined potentials, the second dummy transistor device being formed on the same substrate as the amplifying transistor device is formed, wherein a potential at a node between the second dummy transistor device and the predetermined resistor element is supplied to the gate of the first dummy transistor device.

With the above structure, the bias circuit for use in an amplifying circuit according to this invention can accomplish the idealistic operation that it serves as a constant current circuit with a constant drain current when there is no high-frequency input signal, and the drain current increases as input power increases when there is a high-frequency input signal. Because no resistor which causes a voltage drop is connected in series between the drain electrode and a positive power supply, a sufficient voltage can be applied between the drain and source so that the full performance of the transistor can be used. This bias circuit can change the gate bias voltage more than the conventional voltage feedback bias circuit in accordance with a given variation in drain current, resulting in an increased current compensating effect. Moreover, the individual transistors and resistor elements of the bias circuit can be formed on the same substrate as an integrated circuit of GaAs FETs, thus significantly simplifying the manufacture of the bias circuit.

DETAILED DESCRIPTION OF THE PREFERRED EMBODIMENTS

Preferred embodiments of the present invention will now be described with reference to the accompanying drawings. Circuits according to the preferred embodiments and modifications are to be considered as illustrative and not restrictive and the invention is not to be limited to the details given herein, but may be modified within the scope of the appended claims.

Figure 1:
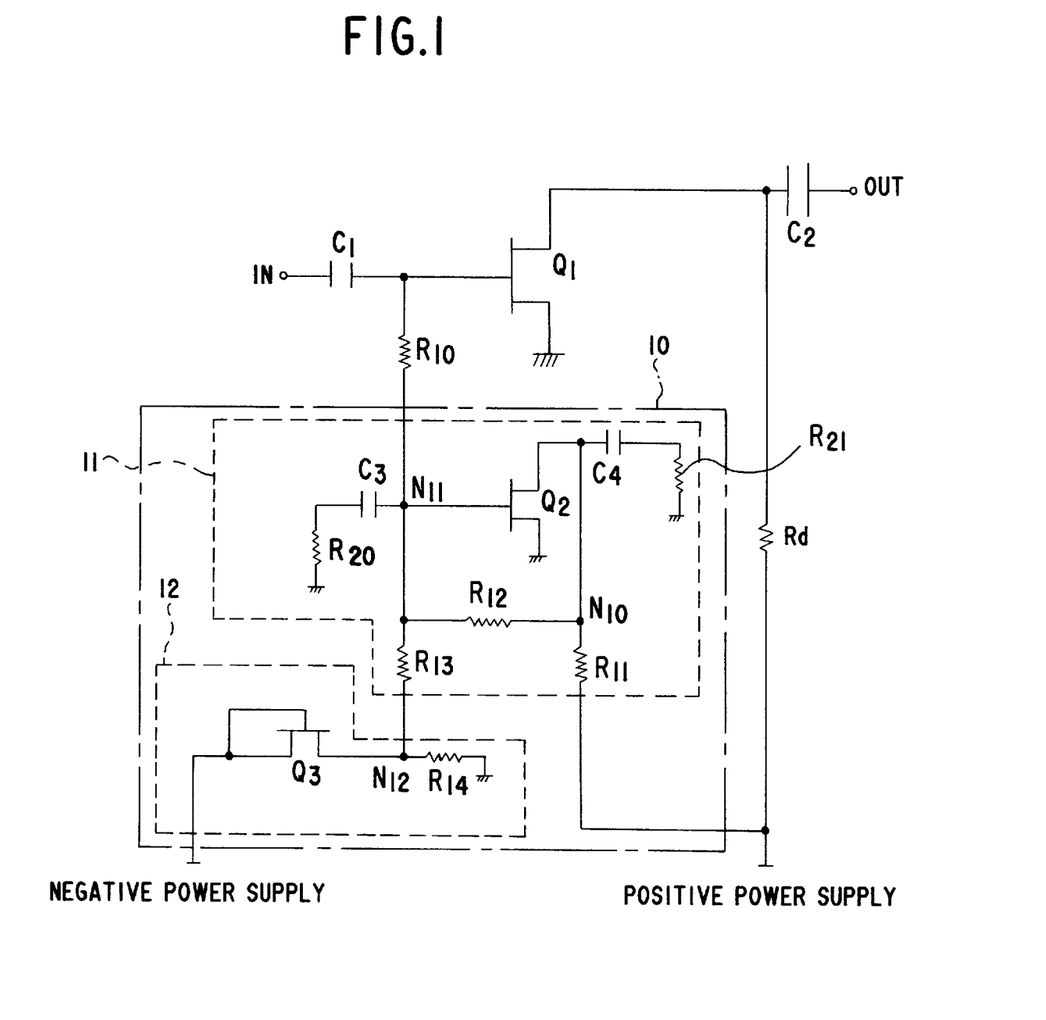
FIG. 1 is a circuit diagram of an amplifying circuit according to the first embodiment of this invention.

FIG. 1 presents a circuit diagram of an amplifying circuit according to the first embodiment of this invention. An amplifying transistor Q1 (GaAs FET), an input coupled capacitor C1 and an output coupled capacitor C2 are the same as those of the prior arts. A gate-voltage bias circuit 10 indicated by the one-dot chain line in FIG. 1 is connected to the gate electrode of the amplifying transistor Q1 via a high resistor R10 or another inductance element. The drain electrode is connected to a positive power supply so that a sufficient voltage is applied between the drain and source of the amplifying transistor Q1. A resistor Rd with a predetermined resistance needed to maximize the performance of the transistor Q1 may be connected between the drain electrode and the positive power supply. This resistor Rd whose resistance should desirably be zero may be realized by a parasitic resistor formed by interconnecting lines or a resistor with a predetermined small resistance. This drain resistance Rd is considerably smaller than the resistance of the resistor R5 in FIG. 17, so that the drain voltage does not fall greatly as compared with the supply voltage.

The bias circuit 10 mainly comprises a first bias voltage generator 11 constituted of a voltage feedback bias circuit section and a second bias voltage generator constituted of a constant current circuit 12 which decreases or increases the output voltage in accordance with a change in drain current caused by a variation in the circuit characteristic. The voltage feedback bias circuit 11 includes a dummy transistor Q2 and resistors R11, R12 and R13. The dummy transistor Q2 is formed on the same semiconductor substrate through the same manufacturing process as the amplifying transistor Q1 and is smaller in size than the amplifying transistor Q1. That is, the structure of the voltage feedback bias circuit 11 is similar to that of the voltage feedback bias circuit shown in FIG. 17. A dummy input coupled capacitor C3 and a terminal resistor R20 are connected to the gate of the transistor Q2, and an output coupled capacitor C4 and another terminal resistor R21 are connected to the drain of the transistor Q2. The resistor R11 on the drain side of the dummy transistor Q2 has a sufficiently larger resistance than the small resistance of the aforementioned resistor Rd intervened between the drain electrode of the amplifying transistor Q1 and the positive power supply.

Since the dummy transistor Q2 is formed on the same semiconductor substrate through the same manufacturing process as the amplifying transistor Q1, the drain saturation current and the pinch-off voltage vary in accordance with a variation in the transistors. If the characteristic of the amplifying transistor Q1 varies in the direction to increase the drain current, the characteristic of the dummy transistor Q2 likewise changes in the direction to increase the drain current. In this case, the potential at a node N10 decreases due to the voltage drop caused by the resistor R11 and the potential at a node N11 decreases at the same time, as has been explained in the case of the prior art shown in FIG. 17. The degree of compensation accomplished in this case is about the same as that accomplished by the prior art in FIG. 17.

The constant current circuit 12, another circuit section of the bias circuit 10, has an ability to increase or decrease the potential at a node N12 in accordance with a variation in drain current. More specifically, the constant current circuit 12 reduces the potential at the node N12 when the drain current of the amplifying transistor Q1 increases, and it increases the potential at the node N12 when the drain current of the amplifying transistor Q1 decreases. Consequently, the potential at the node N11 which is the result of the voltage division by the resistors R12 and R13 connected between the node N10 and node N12 decreases or increases accordingly. That is, the bias voltage of the amplifying transistor Q1 is made deeper or shallower.

In the constant current circuit 12 exemplified in FIG. 1, a second dummy transistor Q3 and a resistor R14 are connected in series between the ground and a negative power supply. The second dummy transistor Q3, like the first dummy transistor Q2, is a small transistor formed on the same semiconductor substrate through the same manufacturing process as the amplifying transistor Q1. When the drain current of the amplifying transistor Q1 increases, the drain current of the second dummy transistor Q3 increases accordingly. Since the gate and source of the dummy transistor Q3 are short-circuited, this dummy transistor Q3 serves as a constant current circuit which supplies a constant current under predetermined conditions, thus keeping the potential at the node N12 constant. When the drain current of the transistor Q3 increases, the voltage drop caused by the resistor R14 increases to reduce the potential at the node N14. Consequently, the bias voltage at the node N11 becomes lower in deep direction by the reduced amount so that the drain current with respect to the variation shown in FIG. 18 is compensated to become constant. When the drain current decreases, on the other hand, the bias voltage at the node N11 increases in shallow direction accordingly.

Although the resistor R14 in the constant current circuit 12 in the bias circuit 10 is connected to the ground in the circuit exemplified in FIG. 1, the same advantage can be acquired by connecting the resistor R14 to the positive power supply. In this case, the resistance of the resistor R14 should be so set as to achieve the purpose.

Since the constant current circuit 12 is connected to the voltage feedback bias circuit 11 in the circuit shown in FIG. 1, the resistor R13 may be omitted as needed.

Figure 2:
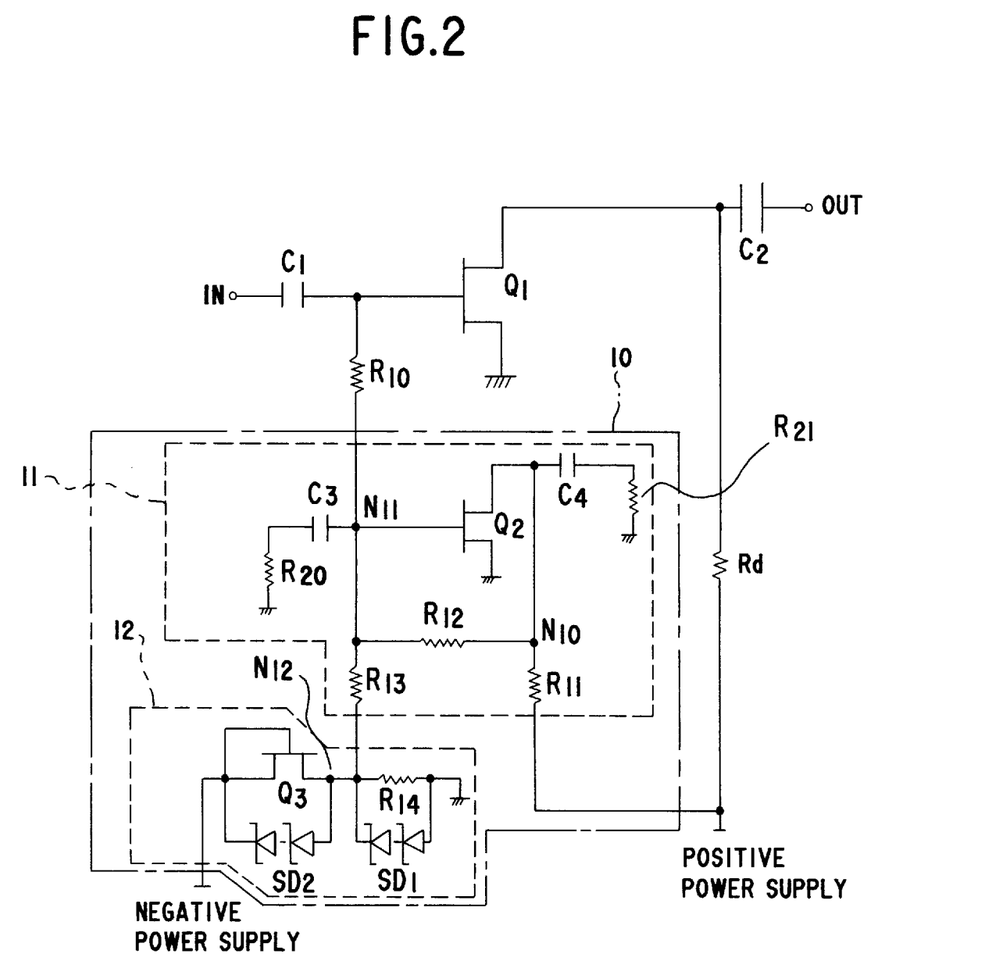
FIG. 2 is a circuit diagram of an amplifying circuit according to the second embodiment of this invention.

FIG. 2 is a circuit diagram of an amplifying circuit according to the second embodiment of this invention. In the circuit exemplified in FIG. 1, the constant current circuit 12 decreases or increases the potential at the node N12 in accordance with a variation in drain current. If overcompensation is achieved, however, fine adjustment can be executed by connecting a predetermined number of Schottky diodes SD1 in parallel to the resistor R14 or connecting a predetermined number of Schottky diodes SD2 in parallel to the transistor Q3 as shown in FIG. 2.

When the drain current of the amplifying transistor Q1 increases, for example, the drain current of the transistor Q3 also increases. As a result, the voltage drop by the resistor R14 becomes greater, thus reducing the potential at the node N12. When the voltage drop by the resistor R14 reaches a certain value, the parallel Schottky diodes SD1 are turned on, clamping the voltage across the resistor R14. Consequently, the potential at the node N12 is clamped to the value which is lower than the ground potential by the ON voltage value of the Schottky diodes SD1 and does not become greater in deep direction.

When the drain current of the amplifying transistor Q1 decreases, the drain current of the transistor Q3 also decreases, reducing the voltage drop by the resistor R14. This causes the potential at the node N12 to increase. When the voltage drop by the resistor R14 becomes equal to or smaller than the certain value, the source-drain voltage of the transistor Q3 increases to turn on the parallel Schottky diodes SD1. Consequently, the source-drain voltage of the transistor Q3 is clamped and the drain current is clamped too, thus preventing the potential at the node N12 from increasing in shallow direction too much.

In any case, the desired adjustment on the compensation effect can be accomplished by properly setting the number of Schottky diodes.

As another example though not illustrated, it is effective to connect a predetermined number of Schottky diodes in parallel to a series circuit of the transistor Q3 and the resistor R14. In this case, the value of the voltage to be applied across the series circuit is determined number of the diodes and the voltage compensation should be performed within that range.

Figure 3:
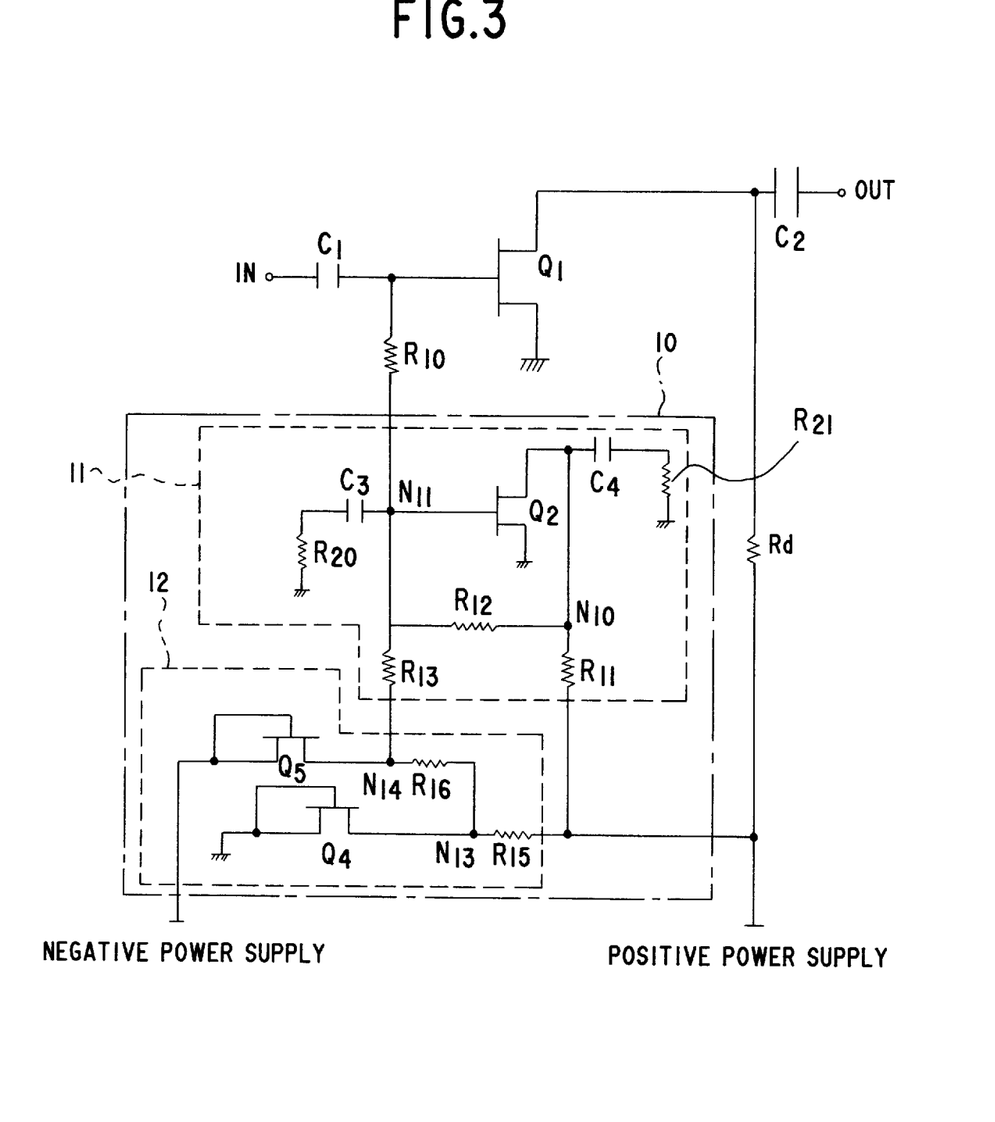
FIG. 3 is a circuit diagram of an amplifying circuit according to the third embodiment of this invention.

FIG. 3 presents a circuit diagram of an amplifying circuit according to the third embodiment of this invention. In this embodiment, the constant current circuit 12 has two stages of series circuits each consisting of a transistor and a resistor in order to further improve the compensation effect by the constant current circuit 12. There are two constant current circuits, the one comprising a transistor Q4 and a resistor R15 and the other comprising a transistor Q5 and a resistor R16 provided between a node N13 and the negative power supply. The resistor R13 is connected to a node between the transistor Q5 and the resistor R16.

With this structure, the potential at the node N13 decreases or increases in accordance with a variation in drain current, and with respect to the decreased or increased potential at the node N13, the circuit comprising the transistor Q5 and the resistor R16 causes the potential at the node N14 to decrease or increase in accordance with a variation in drain current. It is therefore possible to change the potential at the node N14 in a wider range, thus ensuring an improved compensation effect.

In both cases of FIGS. 2 and 3, the resistor R13 may be omitted as per the example shown in FIG. 1.

Figure 4:
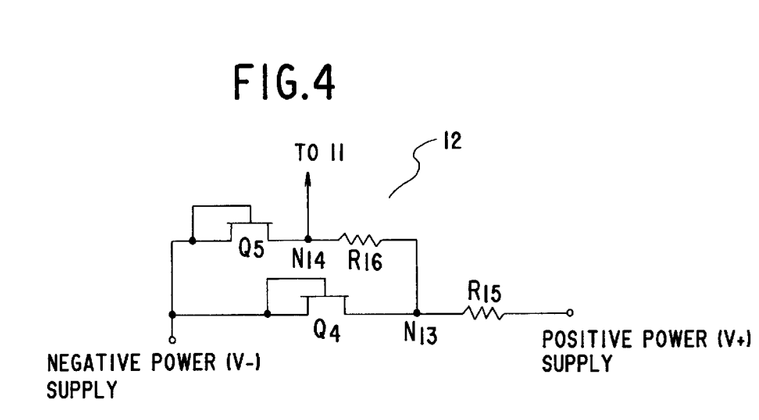
FIG. 4 is a circuit diagram showing another example of a constant current circuit in FIG. 3 according to the third embodiment.

FIG. 4 shows another example of the constant current circuit 12 in FIG. 3 according to the third embodiment. Although the source of the transistor Q4 in the constant current circuit 12 in FIG. 3 is grounded, it is connected together with the transistor Q5 to the negative power supply in the example in FIG. 4. Accordingly, the resistance of the resistor R15 in the circuit in FIG. 4 differs from that in FIG. 3. The example in FIG. 4 is effective from the viewpoint of the circuit design when the connection to the negative power supply is more convenient than the connection to the ground. The performance of the constant current circuit 12 in FIG. 4 is the same as that in FIG. 3.

Figure 5:
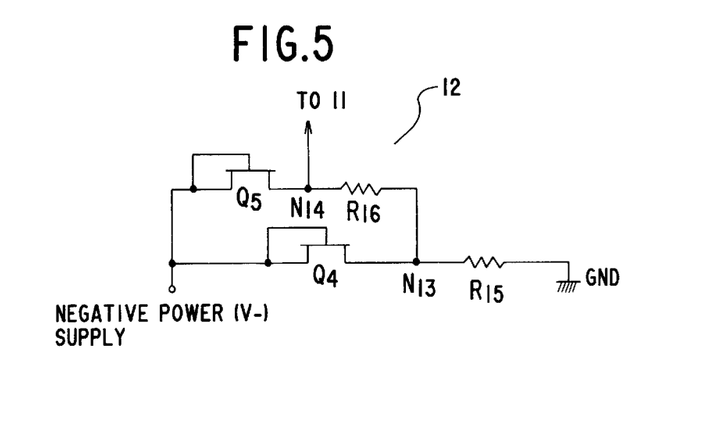
FIG. 5 is a circuit diagram illustrating a modification of the constant current circuit in FIG. 4.

FIG. 5 shows a modification of the constant current circuit 12 in FIG. 4 in which the end of the resistor R15 which is located opposite to the node N13 is connected to the ground, not the positive power supply. In any of the constant current circuits 12 shown in FIGS. 3 to 5, a potential according to a variation in the drain current of the transistor is formed at the node N13 by the transistor Q4 and the resistor R15, and a potential according to a variation in drain current is also formed at the node N14 by the transistor Q5 and the resistor R16, which are provided between the node N13 and the negative power supply.

Figure 6:
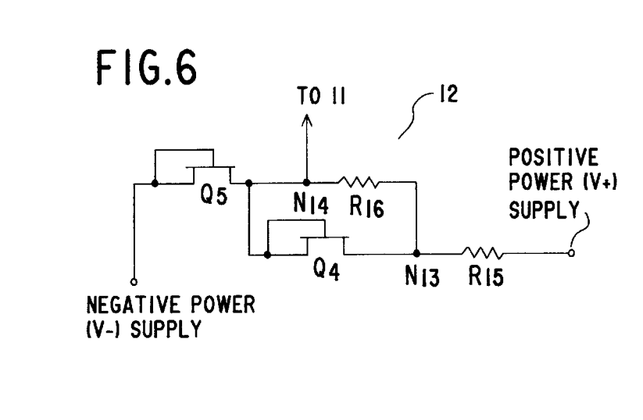
FIG. 6 is a circuit diagram showing a modification of the constant current circuit in FIG. 3.
Figure 7:
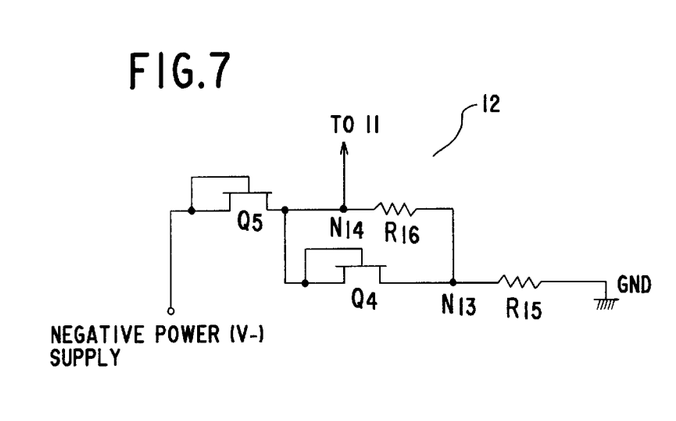
FIG. 7 is a circuit diagram depicting another modification of the constant current circuit in FIG. 6.

FIGS. 6 and 7 illustrate modifications of the constant current circuit 12 in FIG. 3. In those modifications, the source of the transistor Q4 is connected to the node N14, not the ground or the negative power supply. The modification in FIG. 6 has the resistor R15 connected to the positive power supply while the modification in FIG. 7 has the resistor R15 grounded, but both circuits perform the same operation.

In those modifications, a potential according to a variation in drain current is formed at the node N13 by the resistor R15 and the transistor Q4 and a potential according to a variation in drain current is formed at the node N14 by the resistor R16 and the transistor Q5.

Figure 8:
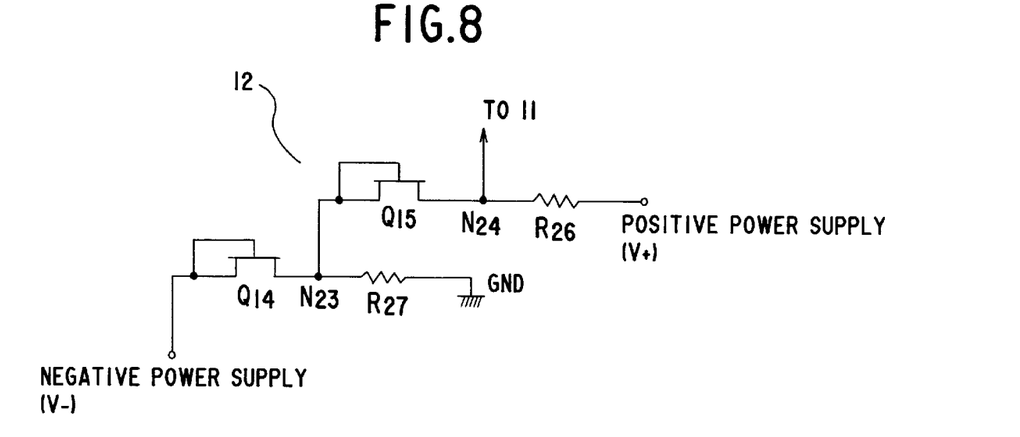
FIG. 8 is a circuit diagram illustrating a further modification of the constant current circuit in FIG. 3.

FIG. 8 illustrates a further modification of the constant current circuit 12 in FIG. 3. This modification is the same as the above-described constant current circuit 12 in that the two-stage constant current circuits give a wider bias range to a node N24. In accordance with the level (large or small) of the drain current, the potential at a node N23 in the constant current circuit which comprises a transistor Q14 and a resistor R27 provided between the ground and the negative power supply becomes lower (deeper) or higher (shallower). In accordance with the level of the drain current, the potential at the node N24 in the other constant current circuit which comprises a transistor Q15 and a resistor R26 provided between the node N23 and the positive power supply becomes lower (deeper) or higher (shallower). Therefore, the potential to be given to the first bias voltage generator 11 varies in a wide range in accordance with the drain current.

Figure 9:
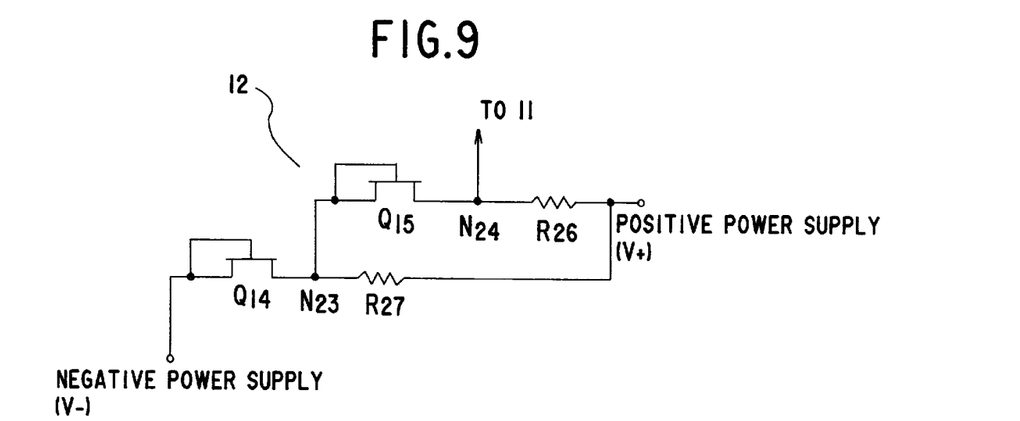
FIG. 9 is a circuit diagram showing a modification of the constant current circuit in FIG. 8.
Figure 10:
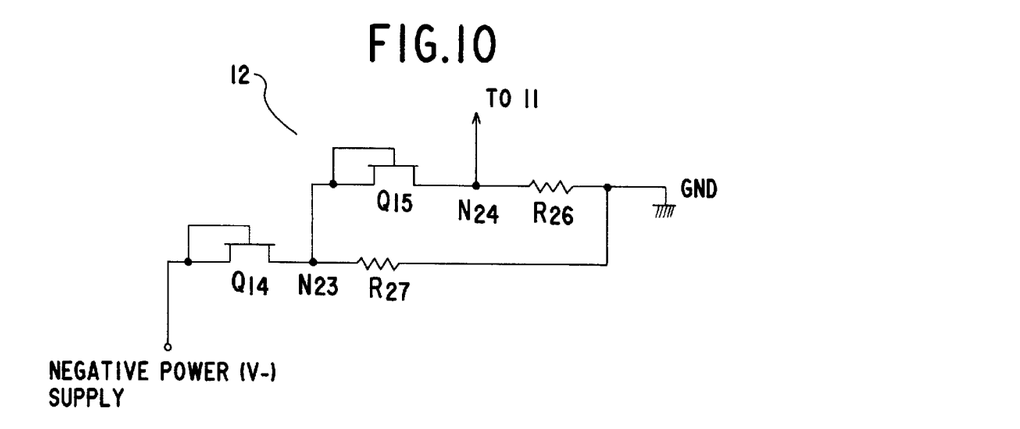
FIG. 10 is a circuit diagram depicting another modification of the constant current circuit in FIG. 8.

FIGS. 9 and 10 illustrate modifications of the constant current circuit 12 shown in FIG. 8. The modification in FIG. 9 has a resistor R27 connected to the positive power supply and the modification in FIG. 10 has resistors R26 and R27 connected to the ground. As the operations of those circuits are the same as that of the circuit in FIG. 8, their descriptions will be omitted.

Figure 11:
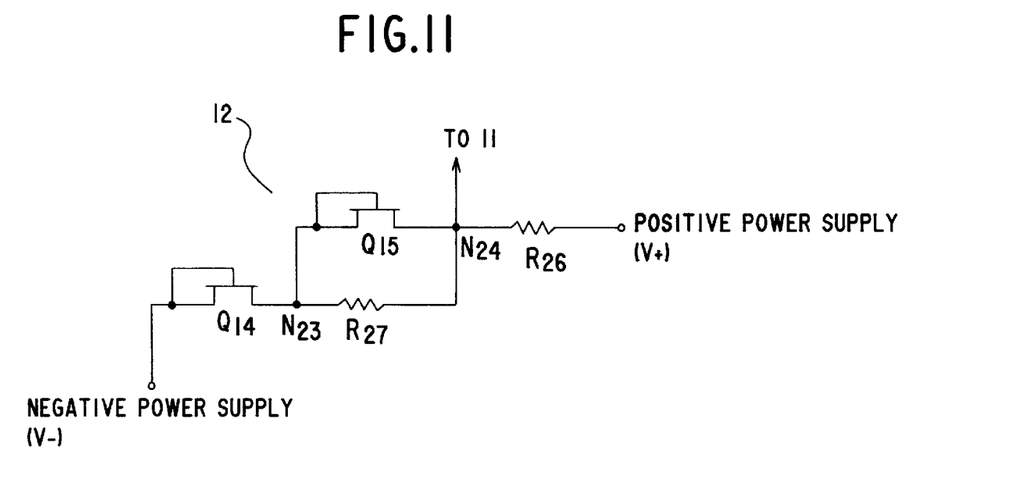
FIG. 11 is a circuit diagram showing a further modification of the constant current circuit in FIG. 8.
Figure 12:
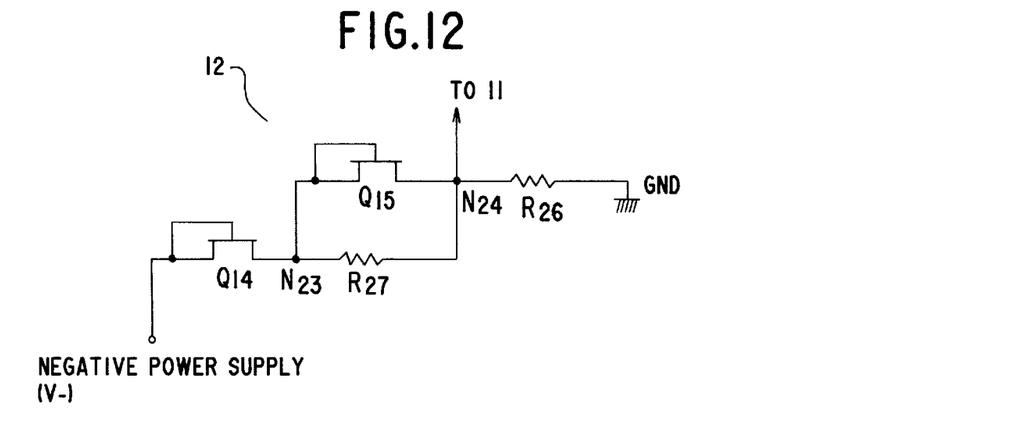
FIG. 12 is a circuit diagram depicting a still further modification of the constant current circuit in FIG. 8.

FIGS. 11 and 12 show further modifications of the constant current circuit 12 in FIG. 8. In the constant current circuits 12 in FIGS. 11 and 12, as in those in FIGS. 6 and 7, the end of the resistor R27 which is opposite to the node N23 is connected to the node N24. The modification in FIG. 11 has the resistor R26 connected to the positive power supply while the modification in FIG. 12 has the resistor R26 grounded. As the operations of those circuits are the same as that of the circuit in FIG. 8, their descriptions will not be repeated.

Figure 13:
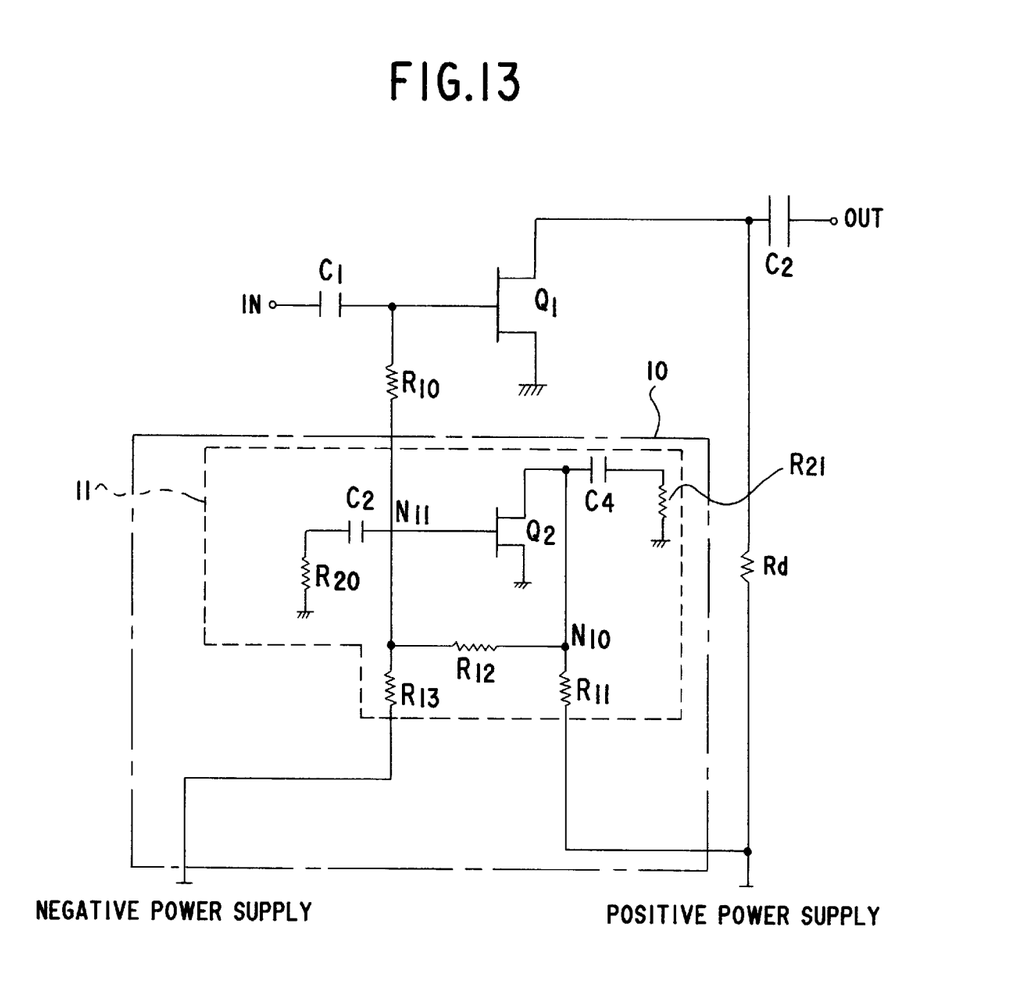
FIG. 13 is a circuit diagram showing an amplifying circuit according to the fourth embodiment of this invention.

FIG. 13 shows an amplifying circuit according to the fourth embodiment of this invention. In this embodiment, the bias circuit 10 which supplies the bias voltage to the gate of the amplifying transistor Q1 is comprised only of the voltage feedback bias circuit 11 which uses the dummy transistor Q2. This amplifying circuit therefore solves the shortcoming of the conventional voltage amplifying circuit shown in FIG. 17 which cannot increase the value of the high-frequency output power as illustrated in FIG. 19 (see the broken lines in the diagram). In the circuit in FIG. 13, the drain of the amplifying transistor Q1 is connected to the positive power supply directly or via the drain resistor Rd which has a negligibly low resistance. Therefore, the voltage from the positive power supply is applied directly between the drain and source of the amplifying transistor Q1.

The resistances of the resistors in the active bias circuit 10 as in FIGS. 1, 2, 3 and so forth, when they are formed on the semiconductor substrate, may vary by ±30% depending on their structures and the manufacturing process. In such a case, it may be effective to form all or some of the resistors in the bias circuit 10 in a discrete chip resistor having a high precision, and connect them to MMIC including transistors Q1, Q2.

In short, according to this invention, since the positive power supply can be connected directly to the drain electrode of the amplifying transistor, the transistor can be used without dropping the drain voltage, thus maximizing the transistor performance. Further, in accordance with an increase in the level of the high-frequency input signal, it is possible to increase the drain current and thus increase the output power. Moreover, the bias circuit of this invention can compensate the drain current to be more constant than the conventional voltage feedback bias circuits. The simulation conducted by the present inventor, which is similar to those illustrated in FIGS. 16 and 18, showed that the circuits of this invention could improve a variation in drain current to ±5% with respect to ±40% variations in the saturation drain current and pinch-off voltage.

What is claimed is:

1. A semiconductor amplifying circuit comprising:
   an amplifying field effect transistor device having a gate supplied with an input signal and a drain for outputting an amplified output signal; and
   a bias circuit for supplying a bias voltage to said gate of said amplifying transistor device, said bias circuit including,
      a first bias voltage generator having a first dummy field effect transistor device formed on a same substrate as said amplifying transistor device is formed, and a voltage feedback bias circuit for supplying a bias voltage to a gate of said first dummy transistor device, and a second bias voltage generator for supplying a lower potential to said voltage feedback bias circuit when a drain current of said field effect transistor device increases, and supplying a higher potential to said voltage feedback bias circuit when said drain current decreases, wherein a gate voltage of said first dummy transistor device is supplied as a bias voltage to said gate of said amplifying transistor device.

2. The semiconductor amplifying circuit according to claim 1, wherein said first bias voltage generator further has a first resistor provided between a drain of said first dummy transistor device and a first potential, and a second resistor provided between a node between said first resistor and said drain of said first dummy transistor device and said gate thereof.

3. The semiconductor amplifying circuit according to claim 2, wherein said second bias voltage generator has a series circuit of a second dummy field effect transistor device and a predetermined resistor element provided between predetermined potentials, said second dummy transistor device being formed on said same substrate as said amplifying transistor device is formed, and a potential at a node between said second dummy transistor device and said predetermined resistor element is supplied to said gate of said first dummy transistor device.

4. The semiconductor amplifying circuit according to claim 3, wherein a predetermined number of Schottky diodes are connected in parallel to said second dummy transistor device.

5. The semiconductor amplifying circuit according to claim 3, wherein a predetermined number of Schottky diodes are connected in parallel to said predetermined resistor element.

6. The semiconductor amplifying circuit according to claim 3, wherein a predetermined number of Schottky diodes are connected in parallel to said series circuit of said second dummy transistor device and said predetermined resistor element.

7. The semiconductor amplifying circuit according to claim 2, wherein said second bias voltage generator includes:

a first series circuit of a second dummy field effect transistor device and a fourth resistor element provided between predetermined potentials, said second dummy transistor device being formed on said same substrate as said amplifying transistor device is formed; and a second series circuit of a third dummy field effect transistor device and a fifth resistor element provided between a node between said second dummy transistor device and said fourth resistor element and a predetermined potential, said third dummy transistor device being formed on said same substrate as said amplifying transistor device is formed, wherein a potential at a node between said third dummy transistor device and said fifth resistor element is supplied to said gate of said first dummy transistor device.

8. The semiconductor amplifying circuit according to claim 7, wherein a source of said third dummy transistor device is connected to a negative power supply, a source of said second dummy transistor device is connected to said negative power supply or ground, and said fourth resistor element is connected to a positive power supply.

9. The semiconductor amplifying circuit according to claim 7, wherein a source of said third dummy transistor device is connected to a negative power supply, a source of said second dummy transistor device is connected to said negative power supply, and said fourth resistor element is connected to ground.

10. The semiconductor amplifying circuit according to claim 2, wherein said second bias voltage generator includes:

a first series circuit of a second dummy field effect transistor device and a fourth resistor element, said second dummy transistor device being formed on said same substrate as said amplifying transistor device is formed; and a second series circuit of a third dummy field effect transistor device and a fifth resistor element, said third dummy transistor device being formed on said same substrate as said amplifying transistor device is formed, a node between said second dummy transistor device and said fourth resistor element being connected to said fifth resistor element, a source of said second dummy transistor device being connected to a node between said third dummy transistor device and said fifth resistor element, said second bias voltage generator being provided between predetermined potentials, wherein a potential at said node between said third dummy transistor device and said fifth resistor element is supplied to said gate of said first dummy transistor device.

11. The semiconductor amplifying circuit according to claim 10, wherein a source of said third dummy transistor device is connected to a negative power supply, and said fourth resistor element is connected to a positive power supply or ground.

12. The semiconductor amplifying circuit according to claim 2, wherein said second bias voltage generator further includes:

a third series circuit of a fourth dummy field effect transistor device and a sixth resistor element provided between predetermined potentials, said fourth dummy transistor device being formed on said same substrate as said amplifying transistor device is formed; and a fourth series circuit of a fifth dummy field effect transistor device and a seventh resistor element provided between a node between said fourth dummy transistor device and said sixth resistor element and a predetermined potential, said fifth dummy transistor device being formed on said same substrate as said amplifying transistor device is formed, wherein a potential at a node between said fifth dummy transistor device and said seventh resistor element is supplied to said gate of said first dummy transistor device.

13. The semiconductor amplifying circuit according to claim 12, wherein a source of said fourth dummy transistor device is connected to a negative power supply, said sixth resistor element is connected to a positive power supply or ground, and said seventh resistor element is connected to said positive power supply.

14. The semiconductor amplifying circuit according to claim 12, wherein a source of said fourth dummy transistor device is connected to a negative power supply, said sixth resistor element is connected to ground, and said seventh resistor element is connected to said ground.

15. The semiconductor amplifying circuit according to claim 10, wherein said second bias voltage generator further includes:

a third series circuit of a fourth dummy field effect transistor device and a sixth resistor element, said fourth dummy transistor device being formed on said same substrate as said amplifying transistor device is formed; and a fourth series circuit of a fifth dummy field effect transistor device and a seventh resistor element, said fifth dummy transistor device being formed on said same substrate as said amplifying transistor device is formed, a node between said fourth dummy transistor device and said sixth resistor element being connected to a source of said fifth dummy transistor device, said sixth resistor element being connected to a node between said fifth dummy transistor device and said seventh resistor element, said second bias voltage generator being provided between predetermined potentials, wherein a potential at said node between said fifth dummy transistor device and said seventh resistor element is supplied to said gate of said first dummy transistor device.

16. The semiconductor amplifying circuit according to claim 15, wherein a source of said fourth dummy transistor device is connected to a negative power supply, and said seventh resistor element is connected to a positive power supply or ground.

17. The semiconductor amplifying circuit according to any one of claims 2 to 16, wherein a terminal resistor is connected via an input coupled capacitor to said gate of said first dummy transistor device, and another terminal resistor is connected via an output coupled capacitor to said drain of said first dummy transistor device.

18. A semiconductor amplifying circuit comprising:

an amplifying field effect transistor device having a drain supplied with a current from a power source via a first resistor; and a bias circuit for supplying a bias voltage to a gate of said amplifying field effect transistor device, said bias circuit including, a dummy field effect transistor device formed on a same substrate as said amplifying transistor device is formed, and a circuit for supplying a current to said drain of said dummy field effect transistor device via a second resistor having a resistance which is greater than said first resistor, a current of said second resistor being larger when a drain current of said dummy field effect transistor device increases than when the drain current decreases, and for supplying a bias voltage formed from the voltage of the drain of the dummy field effect transistor device to said gate of said dummy field effect transistor device, wherein a gate voltage of said dummy field effect transistor device is supplied as a bias voltage to said gate of said amplifying field effect transistor device.

* * * * *